(12) United States Patent
Lemmer et al.

(10) Patent No.: US 12,173,397 B2
(45) Date of Patent: Dec. 24, 2024

(54) SPUTTERING TARGET

(71) Applicant: CemeCon AG, Würselen (DE)

(72) Inventors: Oliver Lemmer, Aachen (DE); Werner Kölker, Herzogenrath (DE); Jürgen Balzereit, Würselen (DE); Stephan Bolz, Aachen (DE)

(73) Assignee: CemeCon AG, Würselen (DE)

( * ) Notice: Subject to any disclaimer, the term of this patent is extended or adjusted under 35 U.S.C. 154(b) by 0 days.

(21) Appl. No.: 18/547,678

(22) PCT Filed: Feb. 22, 2022

(86) PCT No.: PCT/EP2022/054443
§ 371 (c)(1),
(2) Date: Aug. 23, 2023

(87) PCT Pub. No.: WO2022/180055
PCT Pub. Date: Sep. 1, 2022

(65) Prior Publication Data
US 2024/0133022 A1   Apr. 25, 2024
US 2024/0229224 A9   Jul. 11, 2024

(30) Foreign Application Priority Data
Feb. 23, 2021 (DE) .................... 10 2021 104 255.0

(51) Int. Cl.
*C23C 14/34* (2006.01)
*C23C 14/14* (2006.01)

(52) U.S. Cl.
CPC .......... *C23C 14/3407* (2013.01); *C23C 14/14* (2013.01)

(58) Field of Classification Search
CPC .. C23C 14/3407; C23C 14/14; H01J 37/3423; H01J 37/3426; H01J 37/3414; H01J 37/3429; H01J 37/3417

(Continued)

(56) References Cited

U.S. PATENT DOCUMENTS

| 4,505,798 A | 3/1985 | Ramachandran et al. |
| 4,724,060 A | 2/1988 | Sakata et al. |

(Continued)

FOREIGN PATENT DOCUMENTS

| DE | 29 40 369 | 5/1981 |
| DE | 10 2008 005 771 | 7/2009 |

(Continued)

OTHER PUBLICATIONS

Güttler, Dominik, "Echtzeit-in-situ-Messung der Oberflächenbelegung einer Magnetron-Kathode bei der reaktiven Sputter-Abscheidung" (Translation of title: "Real-time in-situ measurement of surface occupancy of a magnetron cathode during reactive sputter deposition."), 2004. p. 13. ISSN 1437-322.

(Continued)

*Primary Examiner* — Rodney G McDonald
(74) *Attorney, Agent, or Firm* — CHRISTENSEN O'CONNOR JOHNSON KINDNESS PLLC (57) ABSTRACT

The invention relates to a sputtering target, a coating system, and a coating method for same. The sputtering target comprises a base plate with a target plate which is secured thereon and which is made of a first sputtering material with a surface and a plurality of recesses formed therein. A plurality of inserts are arranged in the recesses. At least some of the inserts are made of a second sputtering material, wherein the second sputtering material has a higher sputter yield than the first sputtering material. The aim of the invention is to achieve especially uniform coatings. This is achieved in that the inserts made of the second sputtering material are shaped such that the extent D1, D2 of the inserts, measured in a measuring direction parallel to the surface, increases from the surface to the base plate in a depth direction T.

19 Claims, 6 Drawing Sheets

(58) Field of Classification Search
USPC .................................. 204/298.12, 298.13
See application file for complete search history.

(56) References Cited

U.S. PATENT DOCUMENTS

| | | | |
|---|---|---|---|
| 4,915,810 A * | 4/1990 | Kestigian | C23C 14/08 |
| | | | 204/298.12 |
| 5,066,381 A * | 11/1991 | Ohta | C23C 14/3407 |
| | | | 204/298.12 |
| 6,709,557 B1 * | 3/2004 | Kailasam | H01J 37/3429 |
| | | | 204/298.12 |
| 6,852,201 B2 | 2/2005 | Hermeler et al. | |
| 8,821,701 B2 | 9/2014 | Higdon et al. | |
| 2003/0173216 A1 * | 9/2003 | Hermeler | C23C 14/3414 |
| | | | 204/192.12 |
| 2013/0081943 A1 | 4/2013 | Loewenthal et al. | |

FOREIGN PATENT DOCUMENTS

| | | |
|---|---|---|
| DE | 100 39 478 | 2/2022 |
| EP | 0634499 | 1/1995 |
| JP | 59-133 369 | 7/1984 |
| WO | 2013003065 | 1/2013 |

OTHER PUBLICATIONS

International Search Report and Written Opinion as mailed on Jun. 14, 2023, issued in corresponding International Application No. PCT/EP2022/054443, filed Feb. 22, 2022, 18 pages.

\* cited by examiner

SPUTTERING TARGET

CROSS-REFERENCES TO RELATED APPLICATIONS

This application is a National Stage of International Application No. PCT/EP2022/054443, filed Feb. 22, 2022, which claims benefit to DE Application No. 10 2021104255.0, filed Feb. 23, 2021, the entire contents of which are incorporated by reference herein in their entirety.

FIELD OF THE INVENTION

The invention relates to a sputtering target, a coating system, and a coating method.

BACKGROUND OF THE INVENTION

A sputtering target is used in sputtering technology, in particular, to coat substrates. In the process, the sputtering target is sputtered by means of particle bombardment. The constituents of the target that are sputtered off enter the gaseous phase and can therefore be used, for example, as materials for surface coatings.

In the case of PVD coating methods, which use cathode sputtering, a sputtering target is connected as the cathode in a coating chamber of a coating system and sputtered by means of positively charged particles, in particular gas and/or metal ions.

In addition to sputtering targets consisting of just one material, sputtering targets comprising multiple materials, in particular different metals, are known. In this connection, in particular, a design is known in which a sputtering target comprises a plate made of a first material and in which bores are provided, wherein plugs consisting of another material are inserted in the bores.

For example, U.S. Pat. No. 6,852,201 discloses a sputtering component for carrying out a PVD coating method, in which sputtering takes place by means of bombardment with gas ions and a layer comprising multiple metal elements is applied to a substrate. The sputtering component consists of a titanium base plate, which comprises bores into which aluminum plugs are pressed. The rate at which aluminum is sputtered off is higher than for titanium, and therefore the aluminum plugs comprise a concave curvature on the exposed surfaces in relation to the base plate.

DE 29 40 369 A1 discloses a target for sputtering off at least two different metal materials. A plate made of a material to be sputtered off comprises continuous bores having a circular cross-section, into which bores bolts made of the second material to be sputtered off are inserted with a secure fit. The bolts comprise a thickened end, which engages in an enlarged end region of the bores that is designed as a counterbore.

SUMMARY OF THE INVENTION

The object can be considered that of proposing a sputtering target, in particular for use in cathode sputtering, which allows for an especially uniform coating.

The object is achieved by a sputtering target, a coating system, and a coating method according to the invention. Dependent claims refer to advantageous embodiments of the invention.

The sputtering target according to the invention comprises a base plate and a target plate secured thereon. The target plate comprises a plurality of inserts that are arranged in recesses formed in the surface of the target plate.

The base plate and/or target plate is preferably planar and/or rectangular. The base and target plate are preferably at least substantially of the same size. The inserts are preferably shaped such that they fill the recesses appropriately, if applicable with a superficial concavely curved depression. The recesses and the inserts that fit therein may have any desired cross-sectional shapes, for example round, triangular, rectangular, square, polygonal, oval, etc. Examples of inserts of various cross-sectional shapes are explained below.

The target plate consists of a first sputtering material and at least some of the inserts, more preferably the majority of inserts, and particularly preferably all inserts, consist of a second sputtering material. A sputtering material should be understood to mean a solid material that can be used for sputtering methods and, in particular, coating methods. Metals, in particular pure metals, are preferred, but other materials such as carbon can be used. Examples of sputtering materials are given in the following.

The materials of the target plate and of the plugs differ from one another. The second sputtering material, of which the plugs consist, has a higher sputter yield than the first sputtering material, of which the target plate consists. For example, the second sputtering material may have a sputter yield that is at least 20%, preferably at least 50%, and even 100% higher than that of the first sputtering material. As is known to a person skilled in the art, the sputter yield is a material-dependent parameter that specifies the average number of target atoms that are emitted per incident ion during the sputtering process. Consequently, in terms of area with uniformly impinging ions, there is a higher rate of sputter erosion at the inserts made of the second sputtering material compared to the target plate.

According to the invention, at least some of the inserts made of the second sputtering material, preferably the majority of inserts, and particularly preferably all inserts have a shape in which the extent, measured in a measuring direction parallel to the surface, increases continuously from the surface to the base plate in a depth direction. This should at least be understood to mean that, in a given insert that has a first extent in the measuring direction at a first, shallower depth and a second extent in the measuring direction at a second, greater depth, the second extent is always greater than the first extent. As such, the extent increases in size in a strictly monotonic manner across the depth. Preferably, the respective cross-sectional area of the inserts thus also increases in a corresponding manner in the depth direction.

In the following, reference is made to the terms "cone" or, alternatively, "conicity" sometimes used for the enlarging shape of the inserts, however there is no restriction to a cone or, alternatively, wedge shape, i.e. a round cross-sectional shape and/or on a continuous linear course is meant, although the latter is preferred.

The conical shape of the inserts has proven advantageous for achieving a composition of the material sputtered off in each case that is as uniform as possible throughout the useful life of the sputtering target. When used in a coating system, the coating produced is composed of the constituents of the material that is sputtered off. The inventors have determined that, in the case of conventional sputtering targets having cylindrical inserts with an advancing degree of wear, there is a reduction in the proportion of the second sputtering material forming the inserts relative to the first sputtering material forming the target plate.

By means of the sputtering target according to the invention, this tendency is counteracted, such that the change in the relative proportion of the second sputtering material is preferably compensated at least partially or, in the ideal case, at least substantially completely. As a result, when used in a coating system, a more uniform layer composition can be achieved throughout the useful life of the sputtering target.

The shape of the inserts, which increases in size across the depth, can be achieved with various designs. For example, the inserts may comprise one or more steps in longitudinal section, at which steps the extent of said inserts increases abruptly in the measuring direction. According to the invention, the shape has a continuous, i.e. steady, increase in extent in the depth direction, wherein this is preferably linear, such that, in the case of a round cross-section, for example, the shape of a truncated cone results at least in portions or, in the case of a rectangular or, alternatively, square cross-sectional shape, the shape of a truncated pyramid results. However, a non-linear progression of the extent in the depth direction is also conceivable. Particularly preferably, the inserts are shaped so as to be continuously conical or pyramidal.

It is possible for all inserts made of the second sputtering material to have the same shape and size. However, it is also possible for the shape, in particular the degree of the conicity, and the size of the different inserts to differ from one another. Corresponding embodiments are explained below.

In the preferred case of a linear progression of the outer contour, when viewed in a longitudinal section of the inserts, compared to a square or cylinder shape, the outer contour may extend in an oblique manner, i.e. at an angle of conicity, at least in one portion of the respective inserts. The angle of conicity may, for example, be in the range of 1 to 20°. Since the depth direction here extends perpendicularly to the surface, the angle formed between the edge in question and the surface is 70° to 89°, for example. An angle of conicity of 4° to 15° (corresponding to an angle of 75° to 86° between the edge and the surface) is preferred; an angle of conicity of 6° to 12° (78° to 84° between the edge and the surface) is particularly preferred. As explained below, the angle of conicity of different inserts of the target may differ.

The preferred enlargement in the cross-sectional area of the inserts may vary in different embodiments. Preferably, the cross-sectional area increases by 4 to 40%, more preferably 8 to 35%, particularly preferably 15 to 30%, over a distance of 5 mm in the depth direction. For inserts with a round cross-sectional area, somewhat lower values of 8 to 30%, particularly preferably 15 to 25%, may be preferred.

The above-mentioned specifications for the degree of the conicity have proven favorable, in particular, for material pairings in which the second sputtering material has a sputter yield that is 50% to 150% higher than that of the first sputtering material.

The base plate and the target plate preferably lie directly one on top of the other in a planar manner. According to a preferred embodiment, the base plate may comprise recesses that are preferably formed in the surface of the base plate that faces the target plate, but that do not fully penetrate the base plate. Some, several, or preferably all inserts made of the second sputtering material preferably project into the recesses in the base plate and, more preferably, can therefore fill same at least substantially completely. As a result, the material of the target plate can be utilized in an improved manner, since the sputtering target can be used for longer without the material of the base plate being sputtered to a significant extent.

The base plate serves on the one hand to mechanically hold and fix the sputtering target and, preferably on the other hand, to ensure good heat distribution and dissipation.

Preferably, the base plate consists completely or at least predominantly of at least substantially pure copper or a copper alloy. The base plate may comprise securing elements or engagement structures for securing elements, for example bores for engaging securing elements.

The first and the second sputtering material may, in particular, be selected from the group comprising C, B, Al, Si and the elements of groups 4 to 6 of the periodic table according to IUPAC (1988) in their pure form or as compounds, alloys, or sintered materials thereof. In particularly preferred embodiments, the material pairing of a first and second sputtering material can be, for example, titanium/aluminum.

The target plate and/or the base plate is preferably rectangular in shape, in particular elongate, i.e. with a length of more than 3 times, preferably more than 5 times its width. The width may, for example, be in the range of 50 to 200 mm, preferably 70 to 150 mm. The length may, for example, be in the range of 200 to 1000 mm, preferably 300 to 700 mm. The thickness of the target plate is preferably relatively low in comparison to its length and width and may preferably be in the range of, for example, 3 to 30 mm, particularly preferably 5 to 15 mm.

The inserts may be arranged in an annular region on the target plate, i.e. along an enclosed strip surrounding the center of the target plate. "Annular" does not necessarily have to be understood to mean a circular shape. Indeed, in the preferred rectangular shape of the target plate, the preferred arrangement of the inserts follows an elliptical path or rather a rounded rectangle.

The inserts are preferably arranged on the target plate along a line, wherein successive inserts are in each case arranged so as to be offset in directions to the side of the line. This arrangement has proven favorable for allowing for a relatively large number of inserts along the main region subjected to loading during cathode sputtering.

It is possible to use inserts of different shapes and/or sizes and to arrange them at different positions on the target plate. This can be advantageous, in particular, if different sputtering conditions are created depending on the position on the target plate, for example due to differing magnetic field strengths in the case of the sputtering target being arranged at a magnetron cathode. In this way, any inhomogeneities can be compensated for. For example, inserts of different cross-sectional areas, in particular different diameters and/or inserts with more or less pronounced conicity can be used. For example, in the case of a rectangular target plate, a first type of inserts of a first size and conicity may be arranged along the long sides of the target plate and a second type may be arranged on the narrow sides. In this way, effects of position-dependent different sputter erosion, resulting from a possible non-homogeneous impact of ions can be compensated for in such a way that a composition of the eroded material is as homogeneous as possible along the length of the sputtering target. Such an inhomogeneous distribution of the erosion can be reacted to by inserts, which are arranged in a particularly loaded first area of the target, having no conicity or a lower conicity than, for example, in a second less loaded area of the target.

When using rectangular targets on unbalanced magnetron cathodes, it has been shown that different regions of the targets are subjected to different amounts of loading depending on the type of electrical excitation. Operation with a direct voltage (DC) results in greater sputter erosion on the narrow sides, and operation according to the HIPIMS method (high-power impulse magnetron sputtering) results in greater erosion in the center of the longitudinal sides. Therefore, in the case of use in the HIPIMS method, targets can for example be provided in which the inserts are not conical or are less conical in a region of a length of, for example, 100 to 350 mm, preferably 200 to 300 mm, arranged for example centrally along the longitudinal sides, than on the narrow sides, for example.

Whereas inserts with a round cross-section are known and have been tried and tested, it has been shown that, in the case of pronounced conicity, i.e. increasing the diameter over the depth direction, it can be difficult to achieve a sufficiently dense arrangement of the inserts in order to obtain high surface proportions of the second sputtering material. According to a preferred embodiment, inserts with a strip-shaped cross-section can therefore be used, in particular. This should be understood to mean a cross-sectional shape in which a maximum longitudinal dimension, i.e. length, is significantly greater than a dimension transverse to the length, i.e. width. The length of strip-shaped inserts preferably corresponds to at least twice the width, preferably at least three times the width. Even longer designs, in which the ratio of length/width corresponds to at least 4, 5, 8, or 10, have also proven favorable. Preferably, the strip shape is at least substantially rectangular, i.e. has two at least substantially parallel long edges. The ends may preferably be rounded. By means of strip-shaped inserts, a relatively large proportion of the area of the surface of the sputtering target can easily be provided with the second sputtering material.

Strip-shaped inserts may have a width of, for example, 5 to 20 mm, preferably 8 to 16 mm, particularly preferably 10 to 15 mm, on the upper side. The length may depend on the arrangement within a rectangular target plate, such that shorter inserts may be used in the case of a transverse arrangement or diagonal arrangement and longer inserts may be used in the case of a longitudinal arrangement. In a short variant, for example, the length may be 20 to 100 mm, preferably 25 to 80 mm, particularly preferably 30 to 50 mm. In a long variant, the length may, for example, be up to 500 mm.

The strip-shaped inserts may be provided with a conicity in that their length and/or width increases in the depth direction. Preferably, both the width and the length increase.

Strip-shaped inserts may preferably be arranged in parallel with one another. An oblique, i.e. diagonal, arrangement of the inserts in a rectangular target surface has proven particularly favorable, wherein the inserts are aligned with their longitudinal axis at an angle of preferably 20 to 70°, particularly preferably 30 to 60°, in particular 450+/−10° relative to the longitudinal and/or transverse edge of a rectangular target surface. In this way, a good homogeneity in the distribution of the first and second sputtering material on the surface of the sputtering target can be achieved.

The invention further relates to a coating system in which a vacuum is generated in a manner known per se by suitable means in a coating chamber and in which a substrate to be coated can be arranged. At least one cathode, preferably a plurality of cathodes, in particular magnetron cathodes, are arranged inside the coating chamber. A sputtering target is mounted on at least one, preferably multiple, or all cathodes.

Finally, the invention relates to a coating method in which a sputtering target according to the invention is sputtered in a vacuum by means of cathode sputtering and a coating of sputtered constituents of the sputtering target is applied to a substrate.

BRIEF DESCRIPTION OF THE DRAWINGS

In the following, embodiments of the invention will be described in greater detail with reference to the drawings, in which.

DETAILED DESCRIPTION OF EMBODIMENTS

The drawings should be understood to be illustrative and not necessarily to scale.

Figure 1:
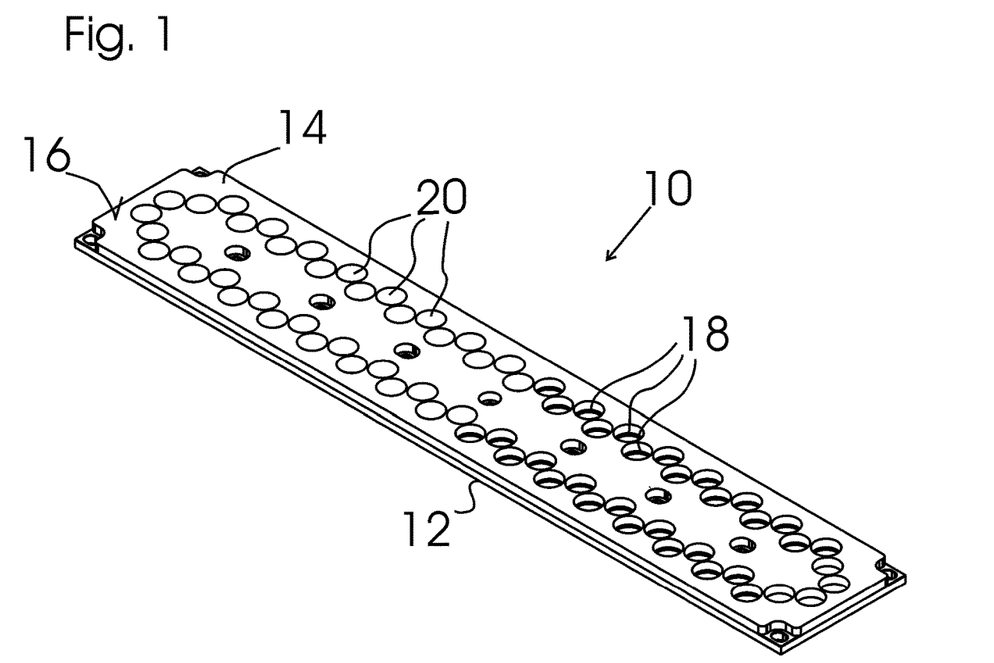
FIG. 1 is a perspective view of a first embodiment of a sputtering target with partially inserted inserts.

FIG. 1 shows a first embodiment of a sputtering target 10.

The sputtering target 10 is of flat, rectangular shape. It comprises a rectangular base plate 12 made of copper and a target plate 14 arranged thereon made of a first sputtering material, in this case pure titanium, by way of example.

Recesses 18 are provided on a front surface 16 of the target plate, into which recesses inserts 20 made of a second sputtering material are inserted, in this case pure aluminum, by way of example. The inserts 20 are also referred to as plugs.

In FIG. 1, to aid understanding, the recesses 18 are shown without inserts 20 inserted therein in the right half of the sputtering target 10 and with inserts 20 in the left half. In reality, inserts 20 are inserted in each of the recesses 18 in the sputtering target 10 in such a way that the recesses 18 are completely or at least predominantly filled. The upper sides of the inserts 20 in each case form a continuous planar surface with the surface 16 of the target plate 14 or, alternatively, adjoin the surface 16 but then have a concave upper indentation (not shown).

Figure 2:
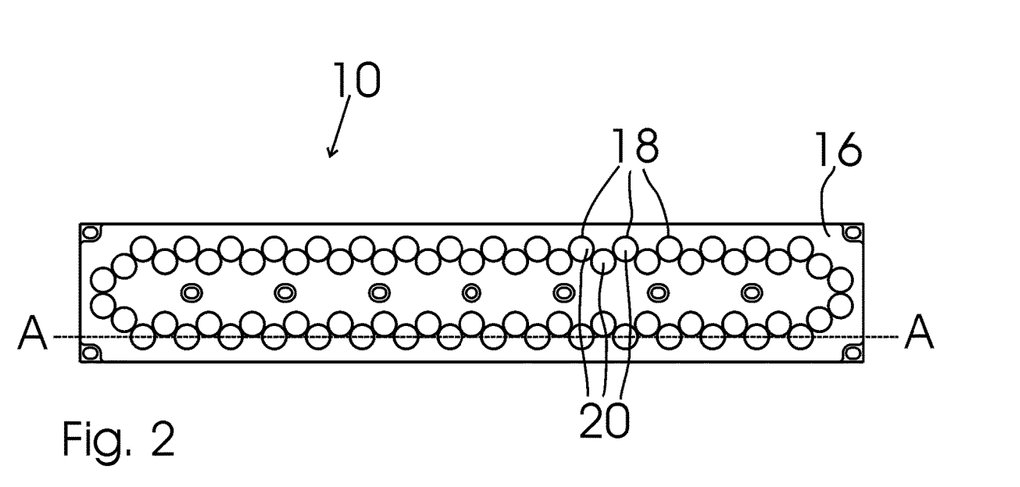
FIG. 2 shows the sputtering target from FIG. 1 in plan view.

The sputtering target 10 is shown in plan view in FIG. 2. The recesses 18 and inserts 20 inserted therein are placed on the surface 16 in an annular arrangement along a circumferential strip that has the shape of a narrow, elongate rectangle with markedly rounded corners. At least along the long edges of the sputtering target 10, successive inserts 20 are arranged so as to be laterally offset with respect to one another in an alternating manner and arranged in such close succession that their edges almost touch.

In the corners, the target plate 14 comprises recesses, whereas the base plate 12 lying thereunder comprises screw holes for securing the sputtering target 10 to a cathode of a coating system, as will be explained in the following in relation to FIG. 5. Furthermore, the target plate 14 and the base plate 12 comprise a row of centrally located bores, which are also used for attachment.

Figure 3:
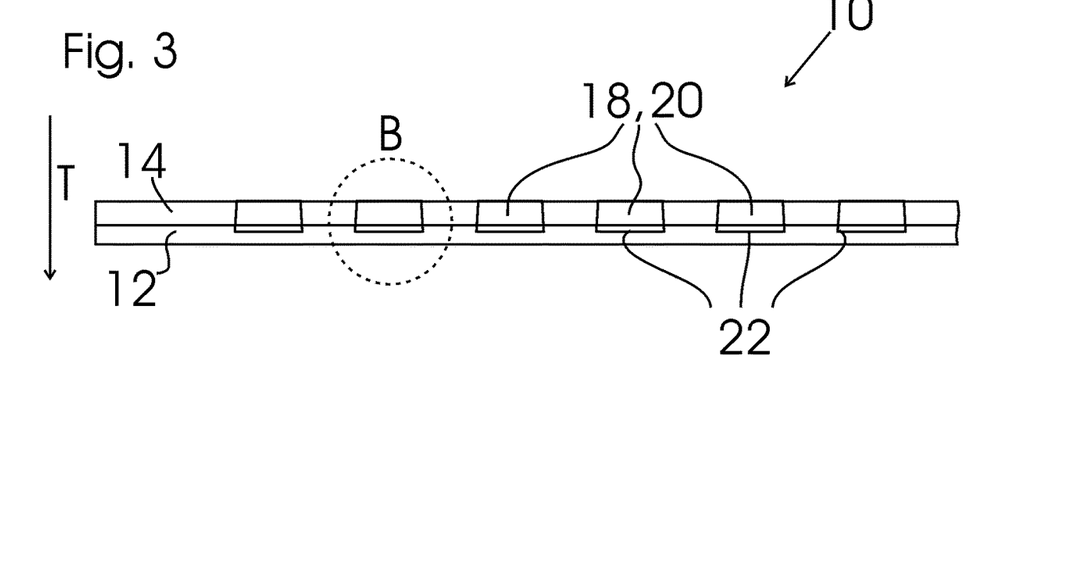
FIG. 3 is a view of a longitudinal section through the target along the line A . . . A in FIG. 2.
Figure 4:
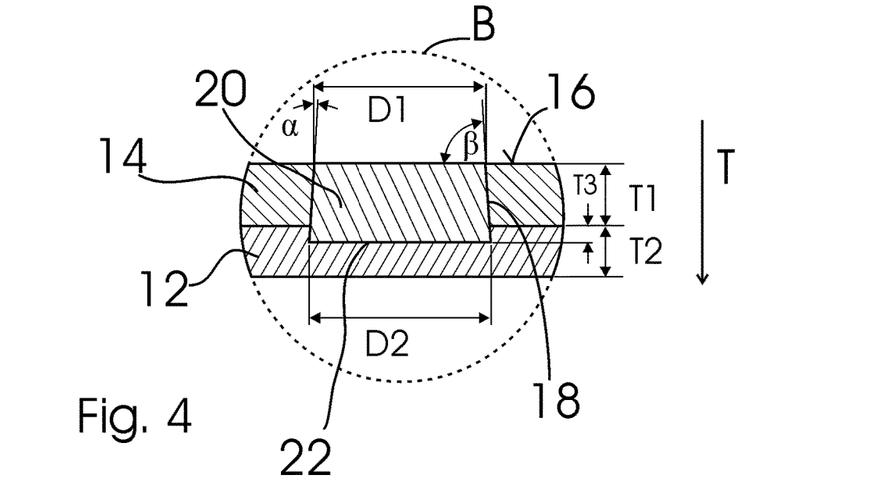
FIG. 4 shows an enlargement of the region B from FIG. 3, which illustrates the shape of an insert according to the first embodiment of the sputtering target.

FIG. 3 shows the arrangement and shape of the base plate 12, target plate 14 and recesses 18, as well as inserts 20 for a longitudinal section through the sputtering target 10 along the line A . . . A in FIG. 2. FIG. 4 shows the region B from FIG. 3 in enlargement.

The inserts 20 each have the same shape in the example shown. Each insert 20 is shaped as a truncated cone with a smaller upper diameter D1 at the surface 16 and a larger lower diameter D2. In a depth direction T that extends from the surface 16 at a right angle toward the base plate 12, the transverse dimension measured here as the diameter therefore increases linearly from the diameter D1 to the diameter D2 in the measuring direction parallel to the surface 16. Consequently, the cross-sectional area of the insert 20, which is measured in each case parallel to the surface 16, increases accordingly.

In the enlarged longitudinal section of FIG. 4, with regard to the contour of the insert 20 shown, it can be seen that the lateral edges thereof that adjoin the edges of the recess 18 extend obliquely, i.e. at an angle of conicity α with respect to the vertical and at an angle β with respect to the surface 16 (wherein obviously β=90°−α is valid).

In the preferred exemplary embodiment shown, the angle α is approx. 8° and the angle β is thus approx. 82°.

FIG. 4 also shows that the insert 20 extends further in the depth direction than it corresponds to the thickness T1 of the target plate 14, namely into recesses 22 in the base plate 12. The base plate 12 here has a thickness T2 and the insert 20 extends by an amount T3 into the base plate 12.

In preferred embodiments, the length or rather the depth of the inserts 20 (T1+T3) is approx. 4 to 20 mm, preferably approx. 7 mm. The upper diameter D1 of the inserts 20 is in the range of, for example, 10 to 20 mm and is preferably approximately 15 mm, and the lower diameter D2 is, for example, 5 to 20% larger than D1, preferably approx. 13% larger.

Figure 5:
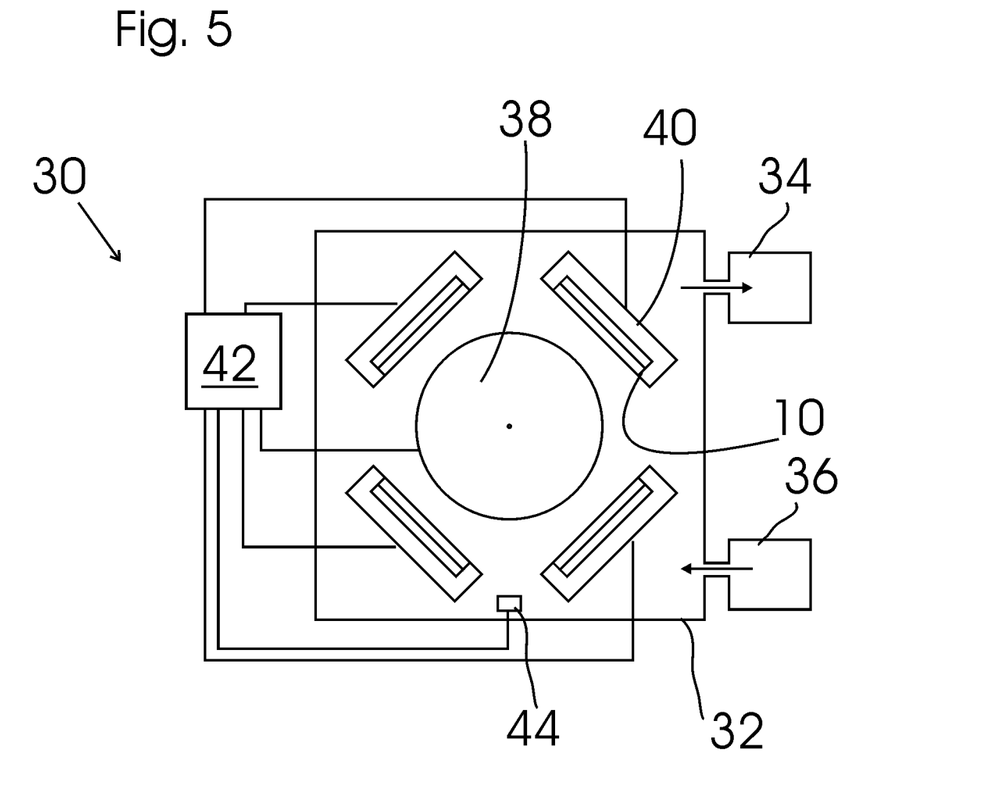
FIG. 5 shows a coating system in a schematic representation.

FIG. 5 schematically shows a coating system 30 with a vacuum chamber 32 in which, by way of example, four cathodes 40 designed as unbalanced magnetrons are arranged around a substrate table 38. Each of the cathodes 40 is equipped with one sputtering target 10 in each case.

Means 34 for generating a vacuum (pump system) and means 36 for supplying process gas and, if applicable, reactive gas are connected to the vacuum chamber 32.

The cathodes 20, the substrate table 38, and an anode 44 also arranged in the vacuum chamber 32 are connected to an electrical power supply system 42.

The coating system 30 may, for example, be constructed and operated as disclosed in WO 98/46807 of the applicant. The content of this document is incorporated herein, in particular with regard to the electrical configuration of the elements of the coating system 30 shown and with regard to the processes during the coating.

In the vacuum chamber 32, a plasma is generated between the cathodes 40 and the anode 44 by the electrical power supply system 42 by means of an electrical voltage such that the sputtering targets 10 are sputtered. Substrates arranged on the substrate table 38 are thus provided with a coating of the sputtered-off constituents of the sputtering target 10.

During operation of the coating system 10, material is eroded from the surface 16 of the sputtering target 10, predominantly along an erosion channel that extends in an annular manner over the sputtering target along the arrangement of inserts 20 (cf. FIG. 2). Material is eroded both from the relevant exposed surface of the target plate 14 and from the inserts 20.

However, the erosion is not uniform, but rather is different for the first sputtering material, in this case titanium, and for the second sputtering material, in this case aluminum, according to the respective sputter yield of said materials.

In the following, values for the sputter yield of some materials at 600 eV are given by way of example (for sputtering with Ar ions):

| | |
|---|---|
| Al (Aluminum) | 1.24 |
| Ti (Titanium) | 0.58 |
| Cr (Chromium) | 1.3 |
| Si (Silicon) | 0.53 |
| V (Vanadium) | 0.7 |
| Ta (Tantalum) | 0.62 |

For the preferred material pairing of titanium/aluminum, the sputter yield of the second sputtering material is therefore approx. 100% higher than the sputter yield of the first sputtering material, titanium.

After a certain operating time, the higher sputter yield of the second sputtering material, of which the inserts 20 consist, results in a surface 16 of the sputtering material that is no longer planar, but rather the inserts 20 are deepened in the manner of a recess. These recesses in turn result in partial shielding against impinging ions, such that the respective proportions of the first and second sputtering material do not result directly from the cross-sections of the inserts 20 and the surface of the target plate 14, taking into account the above-mentioned sputter yield, but rather the situation is more complex. However, in any event, in the comparative case of cylindrical inserts 20 not according to the invention, the proportion of the second sputtering material in the vacuum chamber 32 or rather of the coating produced on the substrate has been shown to decrease throughout the service life of the sputtering target 10.

In the case of the conical shape of the inserts 20 shown in FIGS. 3 and 4, which inserts increase in size in the depth direction, the progressive erosion gradually exposes a progressively larger area. This counteracts or, in the ideal case, completely compensates for the drop in the proportion of the second sputtering material.

Whereas in the above-described embodiment of the sputtering target 10 all inserts 20 have the same shape, the shapes of the individual inserts 20 of the same sputtering target 10 may also differ from one another, in particular inserts 20 may have differing conicities (i.e., in particular, different angles of conicity) or inserts 20 may have a cylindrical shape, i.e. no conicity.

As such, as an alternative embodiment (not shown), a sputtering target 10 is proposed which has the same shape as the target plate 14 and the same number and arrangement of inserts 20 as the sputtering target 10 shown, wherein inserts 20 of cylindrical shape, i.e. without conicity, are nonetheless provided along a distance of, for example, 250 mm centrally along the longitudinal sides of the target plate 14. A target of this kind is particularly suitable for operation according to the HIPIMS method, in which there is more erosion in the center of the longitudinal sides.

FIGS. 6 and 7a to 7c show a sputtering target 110 according to a preferred second embodiment as well as inserts 120 therefor. The sputtering target 110 according to the second embodiment largely corresponds to the sputtering target 10 according to the first embodiment; identical parts are provided with the same reference signs. Like the sputtering target 10, the sputtering target 110 comprises a rectangular target plate 14 with a base plate 12 (not visible in FIG. 6) arranged thereunder.

In the following, reference shall only be made to the differences between the embodiments.

Figures 6, 7A, 7B, 7C:
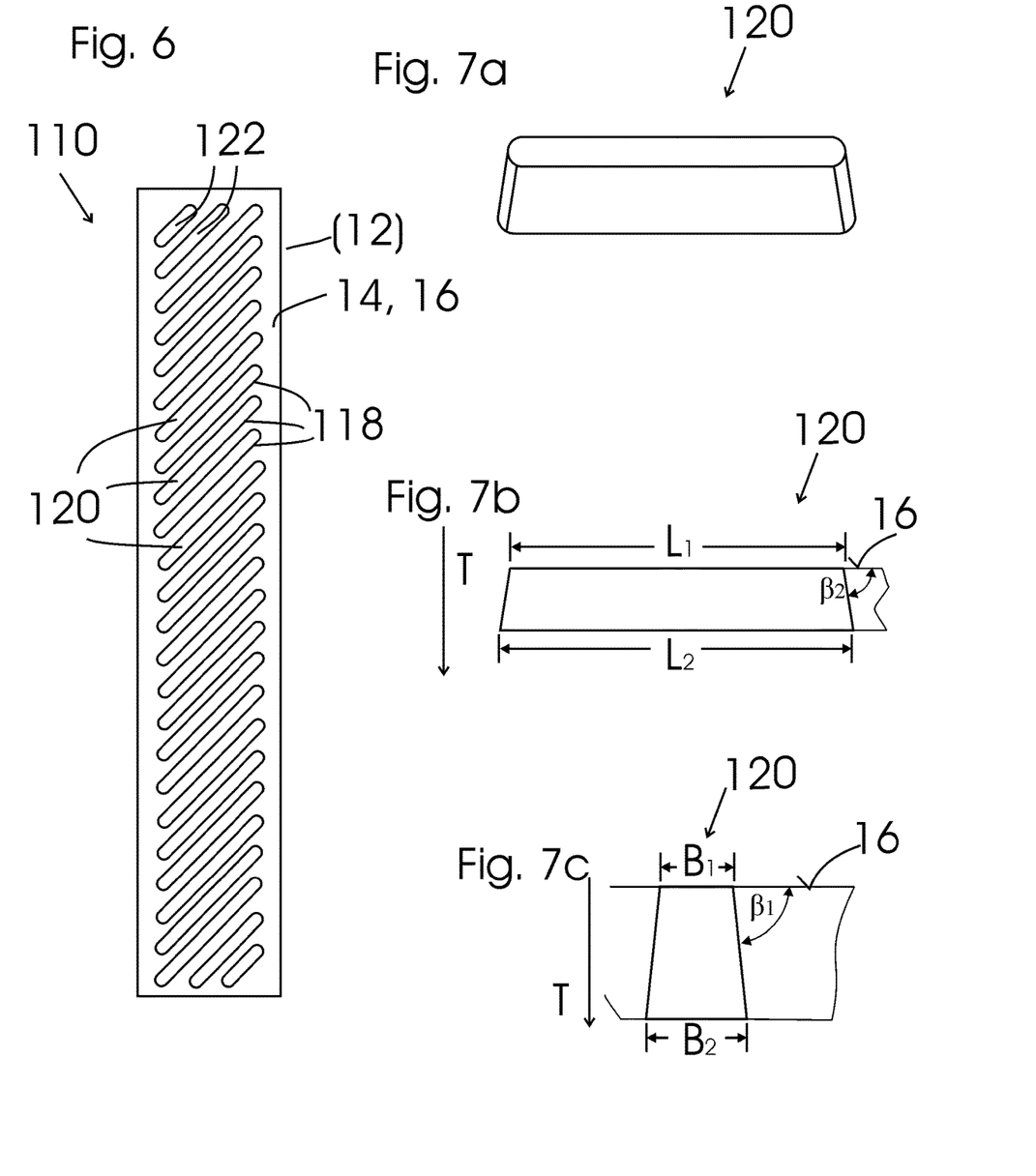
FIG. 6 is a plan view of a second embodiment of a sputtering target with inserted inserts.
FIG. 7a to 7c are views of an insert of the sputtering target according to FIG. 6.

The second embodiment differs from the first embodiment on account of the differing cross-sectional shape of the recesses 118 and of the inserts 120 fittingly received therein. Said inserts each have a strip-shaped, i.e. elongate rectangular, cross-section, but with rounded ends.

The recesses 118 and inserts 120 are conical, i.e. they increase in size in the depth direction T. At the surface 16, the inserts 120 have a length L1 and, at the lower end, a length L2, which is greater than L1. Transversely thereto, a width B2 at the lower end is also greater than a width B1 at the surface 16. On account of the elongate shape, the length L1, L2 is in each case significantly larger than the associated width B1, B2 and in this case is approximately 10 times larger. Different inserts 122, i.e. shortened inserts, are fittingly received in corresponding recesses merely at the longitudinal ends of the target plate 14.

In the case of the sputtering target 110 according to the second embodiment, the target plate 14 preferably is made of titanium and the inserts 120 are made of aluminum. The width of the inserts 120 increases in the depth direction T from the width B1 to the width B2, such that—viewed in the longitudinal direction of the inserts 120—the side wall extends at an angle $\beta1$. At the same time, the length of the inserts 120 increases in the depth direction T from the length L1 to L2, such that—viewed in the transverse direction of the inserts 120—the side wall extends at an angle $\beta2$. Therefore, the cross-sectional area of the inserts 120 increases (parallel to the surface 14) from the surface 16 from an area L1×B1 in the depth direction T to an area L2×B2 (wherein the rounding is not taken into account in this calculation).

The dimensions for the sizes L1, L2, B1, B2, $\beta1$, $\beta2$ may differ for different embodiments. In particular, L1=L2 or B1=B2 is possible, i.e. the inserts 120 may be only be conical in a longitudinal or transverse direction, for example. In particular, it may prove simpler from a manufacturing point of view to only provide conicity in the transverse direction but not in the longitudinal direction (i.e. L1=L2), since the influence of conicity in the transverse direction is more pronounced anyway.

In a preferred exemplary embodiment, the inserts 120 may, for example, be characterized by the following values:
L1=95 mm
L2=95 mm (at a depth T of 5 mm)
B1=15 mm
B2=18 mm (at a depth T of 5 mm)
$\beta1$=73.3°
$\beta2$=90°.

This results in an increase in the cross-sectional area of approx. 20% at a depth of 5 mm compared to the surface 16.

According to the embodiment in FIG. 6, the elongate inserts 120 extend in parallel with one another on the surface 16 in a diagonal alignment with respect to the edges of the target plate 14, in this case at an angle of approx. 45°.

On account of the elongate shape of the inserts 120, a higher proportion of the material of the inserts 120 (here: aluminum) with respect to the material of the target plate 114 (here: titanium) can be achieved at the surface 16 compared with the round cross-section of the inserts 20 according to the first embodiment. Above all, on account of the conicity of the inserts 120, a significant increase in the proportion of the material of the inserts 120 to the total surface area can be achieved in a simpler manner without causing problems with the placement of the inserts 120 one next to the other.

Figures 8, 9:
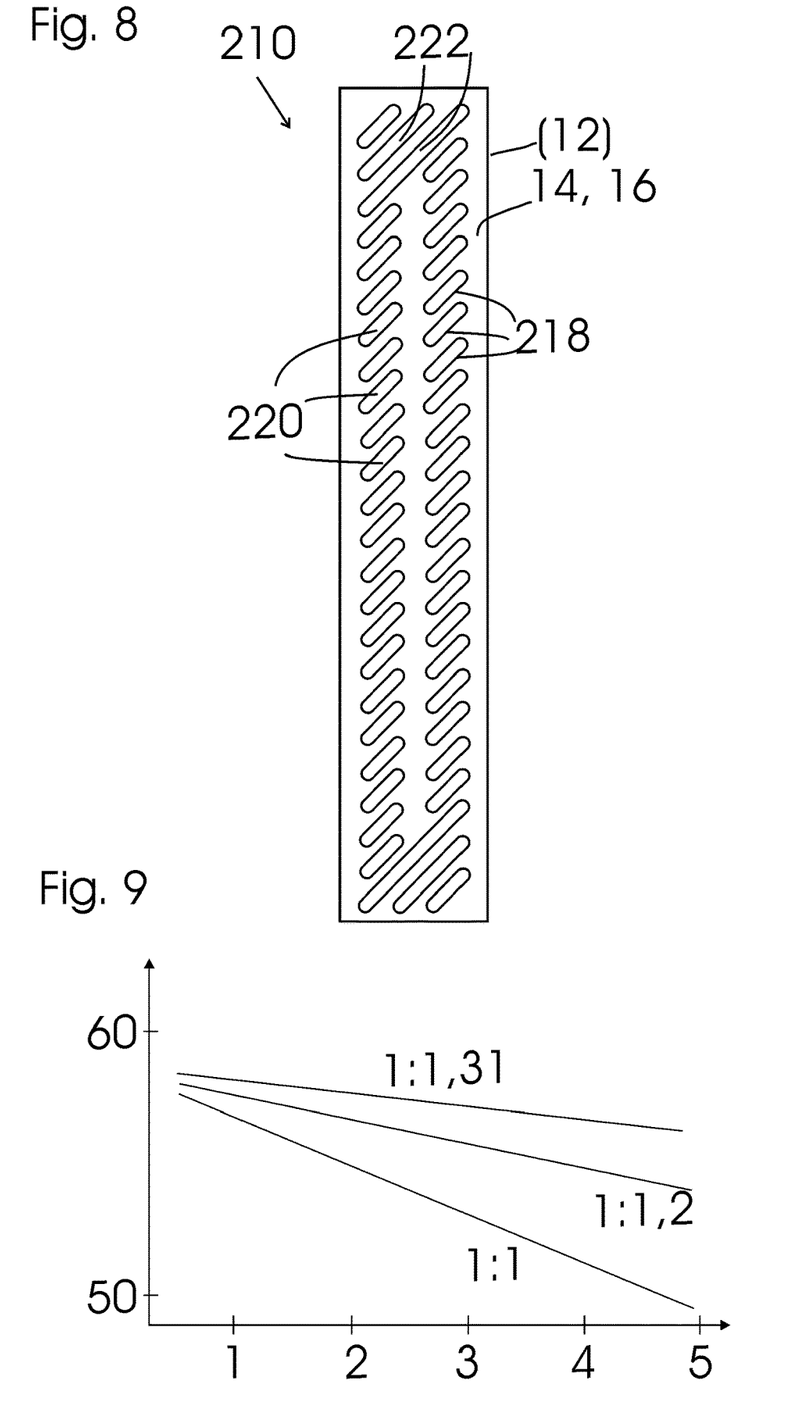
FIG. 8 is a plan view of a third embodiment of a sputtering target with inserted inserts.
FIG. 9 is a graph showing the progression of the proportion of a sputtering material against the erosion of a sputtering target.

FIG. 8 shows a sputtering target 210 according to a third embodiment. The sputtering target 210 according to the second embodiment largely corresponds to the sputtering target 110 according to the second embodiment; in this case, too, identical parts are provided with the same reference signs. In the following, reference shall only be made to the differences between the embodiments.

In the case of the third embodiment, the recesses 218 and the inserts 220 inserted therein are also elongate, but with a width-to-length ratio of approx. 1:4 they are significantly shorter. The inserts 220 are aligned so as to be diagonal, again at approx. 45° with respect to the edges, and are arranged in two parallel rows along the longitudinal edges of the target plate 14. The inserts 220 are also conical, i.e. their length and/or width increases in the depth direction T (not shown in FIG. 8).

The representations of the inserts 120 according to FIG. 7a to 7c also apply to the inserts 220, i.e. the dimensions L1, L2, B1, B2, $\beta1$, $\beta2$ also apply to the shape and increase in size in the depth direction T. According to a preferred exemplary embodiment, these dimensions may be selected as follows:
L1=31 mm
L2=34 mm (at a depth T of 5 mm)
B1=15 mm
B2=18 mm (at a depth T of 5 mm)
$\beta1$=73.3°
$\beta2$=73.3°.

This results in an increase in the cross-sectional area of approx. 32% at a depth of 5 mm compared to the surface 16.

FIG. 9 shows results of coating tests using various sputtering targets 210 according to the third embodiment. Coatings were applied in the system 30 as described above by means of the sputtering target 210 consisting of a target plate 14 made of titanium and inserts 220 made of aluminum. The aluminum content (in at. % of the metal layer contents) in the layers produced against the erosion of the sputtering target 210 (in mm) is shown.

In FIG. 9, three different curves are shown for different conicities of the inserts 220, indicated in each case by the area ratio between the cross-sectional area at the surface 16 and at the lower end. The lowermost line, denoted by 1:1, thus represents inserts which do not increase in size in the depth direction (comparative example); the two lines above show the curves for low conicity (1:1.2, i.e. 20% increase in cross-sectional area over 5 mm depth) and greater conicity (1:1.3, i.e. 30% increase in cross-sectional area over 5 mm depth).

In the comparative example of the non-conical inserts (line 1:1), there is a sharp drop in the Al content from initially approx. 58 at. % to less than 50 at. % when the sputtering target is eroded to a depth of 5 mm. Even a conicity with a 20% increase in the cross-sectional area significantly reduces the drop in the Al content to approx. 54 at. %. An even greater conicity with a 30% increase in the cross-sectional area again produces a drop in the Al content, however this time it is significantly less pronounced.

Figure 10:
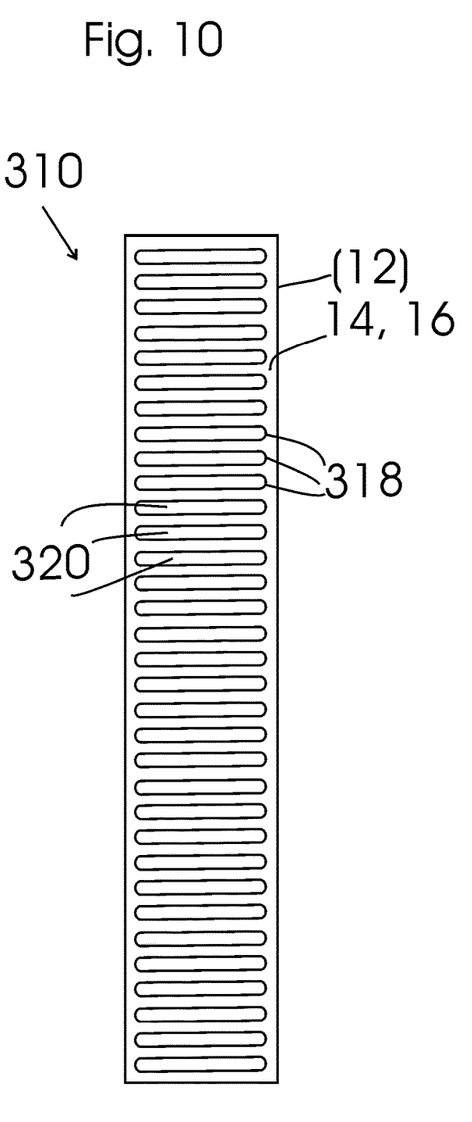
FIG. 10, 11 is a plan view of a fourth and fifth embodiment of a sputtering target with inserted inserts.
Figure 11:
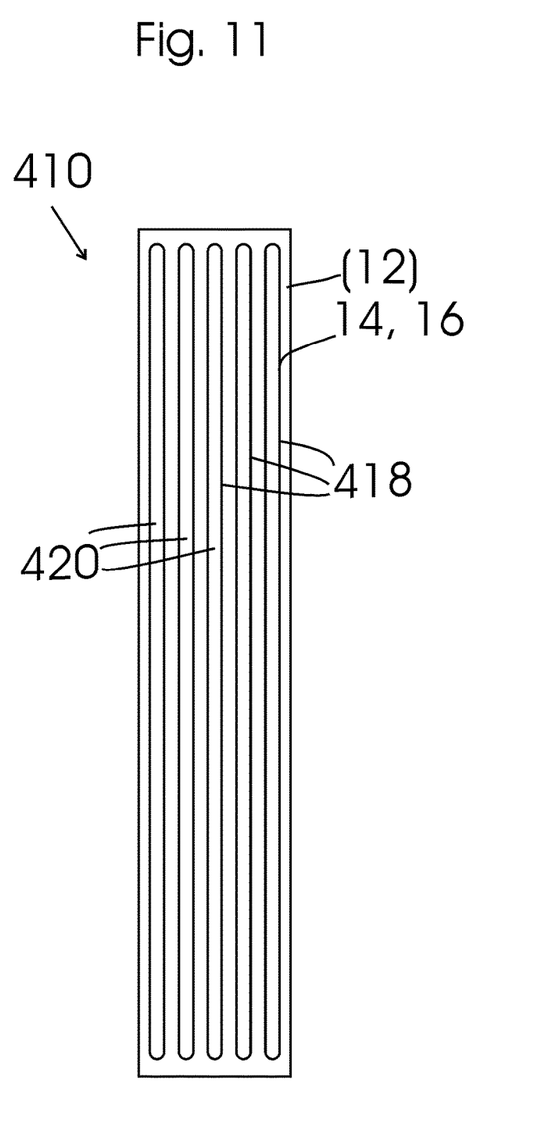

FIGS. 10 and 11 show sputtering targets 310, 410 according to a fourth and fifth embodiment. The sputtering target 310, 410 according to the fourth and fifth embodiments largely corresponds to the sputtering targets 110, 210 according to the previously described embodiments; in this case, too, identical parts are provided with the same reference signs. In the following, reference shall only be made to the differences between the embodiments.

In the fourth and fifth embodiments, the recesses 318, 418 and inserts 320, 420 inserted therein are not arranged diagonally, but rather in parallel with the edges of the target plate 14; in the example of FIG. 10, they are in parallel with the narrow sides, and in FIG. 11 they are in parallel with the long sides. In this case, too, the inserts 320, 420 are also conical, i.e. their length and/or width increases in the depth direction T (not shown in FIGS. 10 and 11).

In summary, it has been shown that a conicity of inserts of a sputtering target can be used to homogenize the relative proportion of the coating materials in the layers produced. Such a conicity can be provided for inserts 20, 120, 220, 320, 420 of different cross-sectional shapes and arrangements in the target plate 14.

The invention claimed is:

1. A sputtering target, comprising
a base plate,
a target plate which is fixed thereon and which consists of a first sputtering material with a surface and a plurality of recesses formed therein,
a plurality of inserts which are arranged in the recesses, wherein at least some of the inserts are made of a second sputtering material,
wherein the second sputtering material has a higher sputter yield than the first sputtering material,
and wherein at least a part of the inserts made of the second sputtering material are shaped such that the extent of the inserts, measured in a measuring direction parallel to the surface, increases continuously from the surface to the base plate over a depth direction.

2. The sputtering target according to claim 1, wherein at least some of the inserts made of the second sputtering material are shaped as a truncated cone with round cross-section.

3. The sputtering target according claim 1, wherein at least some of the inserts made of the second sputtering material are shaped such that their cross-sectional area increases by 4 to 40% over a depth of 5 mm in the depth direction.

4. The sputtering target according to claim 1, wherein at least some of the inserts made of the second sputtering material are shaped such that, in longitudinal section, an edge extends at an angle of 78° to 89° to the surface.

5. The sputtering target according to claim 1, wherein the base plate comprises recesses,
and the inserts made of the second sputtering material project into the recesses in the base plate.

6. The sputtering target according to claim 1, wherein the first sputtering material is titanium and the second sputtering material is aluminum.

7. The sputtering target according to claim 1, wherein the base plate consists completely or at least predominantly of copper or a copper alloy.

8. The sputtering target according to claim 1, wherein all inserts are arranged in an annular region on the target plate.

9. The sputtering target according to claim 1, wherein the inserts are arranged along a line on the target plate, wherein the inserts are in each case arranged so as to be offset in directions to the side of the line.

10. The sputtering target according to claim 1, wherein the shape and/or size of two inserts arranged at different positions on the target plate differs.

11. The sputtering target according to claim 1, wherein the inserts have a strip-shaped cross-section with a length that corresponds to at least twice a width.

12. The sputtering target according to claim 11, wherein the length or width increases in the depth direction.

13. The sputtering target according to claim 11, wherein the target plate is rectangular,
and the strip-shaped inserts are aligned at an angle of 20 to 70° relative to a longitudinal or transverse edge of the target plate.

14. A coating system, comprising
a coating chamber,
means for generating a vacuum in the coating chamber,
means for arranging a substrate to be coated in the coating chamber,
and at least one cathode, which is arranged in the coating chamber,
wherein a sputtering target according to claim 1 is mounted on the cathode.

15. A coating method, wherein
a sputtering target according to claim 1 is sputtered in a vacuum by means of cathode sputtering and a coating of sputtered constituents of the sputtering target is applied to a substrate.

16. The sputtering target according to claim 11, wherein the length and width increase in the depth direction.

17. The sputtering target according to claim 1, wherein at least some of the inserts made of the second sputtering material are shaped so as to be pyramidal.

18. The sputtering target according to claim 1, wherein the recesses are formed in the surface of the target plate arranged at a distance from edges of the target plate.

19. A sputtering target, comprising
a base plate,
a target plate which is fixed thereon and which consists of a first sputtering material with a surface and a plurality of recesses formed therein,
a plurality of inserts which are arranged in the recesses, wherein at least some of the inserts are made of a second sputtering material,
wherein the second sputtering material has a higher sputter yield than the first sputtering material,
and wherein at least a part of the inserts made of the second sputtering material are shaped such that the extent of the inserts, measured in a measuring direction parallel to the surface, increases continuously from the surface to the base plate over a depth direction,
wherein the inserts have a strip-shaped cross-section with a length that corresponds to at least twice a width,
wherein the target plate is rectangular,
and wherein the strip-shaped inserts are aligned at an angle of 20 to 70° relative to a longitudinal and/or transverse edge of the target plate.

* * * * *